United States Patent
Nufio-Molina et al.

(10) Patent No.: US 11,089,687 B2
(45) Date of Patent: Aug. 10, 2021

(54) ADDITIVE MANUFACTURING TECHNOLOGY (AMT) LOW PROFILE SIGNAL DIVIDER

(71) Applicant: RAYTHEON COMPANY, Waltham, MA (US)

(72) Inventors: Jonathan E. Nufio-Molina, Methuen, MA (US); Thomas V. Sikina, Acton, MA (US); James E. Benedict, Lowell, MA (US); Andrew R. Southworth, Lowell, MA (US); Semira M. Azadzoi, Tewksbury, MA (US)

(73) Assignee: RAYTHEON COMPANY, Waltham, MA (US)

( * ) Notice: Subject to any disclaimer, the term of this patent is extended or adjusted under 35 U.S.C. 154(b) by 109 days.

(21) Appl. No.: 16/287,260

(22) Filed: Feb. 27, 2019

(65) Prior Publication Data

US 2019/0269021 A1    Aug. 29, 2019

Related U.S. Application Data

(60) Provisional application No. 62/636,375, filed on Feb. 28, 2018.

(51) Int. Cl.
*H05K 1/02* (2006.01)
*H05K 1/16* (2006.01)
(Continued)

(52) U.S. Cl.
CPC .............. *H05K 1/16* (2013.01); *H01C 7/00* (2013.01); *H01C 7/006* (2013.01); *H01P 5/16* (2013.01);
(Continued)

(58) Field of Classification Search
CPC ...... H05K 1/16; H05K 1/0219; H05K 1/0242; H05K 1/025; H05K 1/167;
(Continued)

(56) References Cited

U.S. PATENT DOCUMENTS

| | | | |
|---|---|---|---|
| 4,647,878 A | * | 3/1987 | Landis ............... H01P 5/183 174/257 |
| 4,875,087 A | | 10/1989 | Miyauchi et al. |

(Continued)

FOREIGN PATENT DOCUMENTS

| CN | 201845850 U | 5/2011 |
|---|---|---|
| CN | 106936521 A | 7/2017 |

(Continued)

OTHER PUBLICATIONS

International Search Report and Written Opinion in application No. PCT/US2018/059636 dated Mar. 4, 2019.

(Continued)

*Primary Examiner* — Hoa C Nguyen
(74) *Attorney, Agent, or Firm* — Lando & Anastasi, LLP

(57) ABSTRACT

A method of manufacturing a power divider circuit includes milling a conductive material disposed upon a first substrate to form a signal trace. The signal trace includes a division from a single trace to two arm traces, with each of the two arm traces having a proximal end electrically connected to the single trace and a distal end electrically connected to each of two secondary traces. The method further includes depositing a resistive ink between the two distal ends to form a resistive electrical connection between the two arm traces, bonding a second substrate to the first substrate to substantially encapsulate the traces between the first substrate and the second substrate, and milling through at least one of the first substrate or the second substrate to provide access to at least one of the traces. A signal divider is further disclosed.

9 Claims, 11 Drawing Sheets

(51) Int. Cl.
*H01P 5/16* (2006.01)
*H01C 7/00* (2006.01)
*B33Y 80/00* (2015.01)

(52) U.S. Cl.
CPC ........... *H05K 1/025* (2013.01); *H05K 1/0219* (2013.01); *H05K 1/0242* (2013.01); *H05K 1/0284* (2013.01); *B33Y 80/00* (2014.12); *H05K 1/167* (2013.01); *H05K 2203/0207* (2013.01)

(58) Field of Classification Search
CPC .. H05K 2203/0207; H01C 7/00; H01C 7/006; H01P 5/16; B33Y 80/00
See application file for complete search history.

(56) References Cited

U.S. PATENT DOCUMENTS

| | | |
|---|---|---|
| 5,401,175 A | 3/1995 | Guimond et al. |
| 5,426,399 A | 6/1995 | Matsubayashi et al. |
| 5,828,555 A | 10/1998 | Itoh |
| 5,857,858 A | 1/1999 | Gorowitz et al. |
| 6,000,120 A | 12/1999 | Arledge et al. |
| 6,137,453 A | 10/2000 | Wang et al. |
| 6,353,189 B1 | 3/2002 | Shimada et al. |
| 6,400,234 B1 | 6/2002 | Ohhashi et al. |
| 6,421,018 B1 | 7/2002 | Zeilinger et al. |
| 6,429,819 B1 | 8/2002 | Bishop et al. |
| 6,486,755 B2 | 11/2002 | Aruga |
| 6,614,325 B1* | 9/2003 | Kocin ............... H01P 5/12 174/251 |
| 6,651,322 B1 | 11/2003 | Currie |
| 6,674,347 B1 | 1/2004 | Maruhashi et al. |
| 6,747,217 B1 | 6/2004 | Jochym et al. |
| 6,937,120 B2 | 8/2005 | Fisher et al. |
| 7,038,622 B2 | 5/2006 | Schmidt et al. |
| 7,405,477 B1 | 7/2008 | Tao et al. |
| 7,443,279 B2 | 10/2008 | Yagisawa et al. |
| 8,749,434 B2 | 6/2014 | Han et al. |
| 10,505,255 B2 | 12/2019 | Baheti et al. |
| 2003/0043084 A1 | 3/2003 | Egashira |
| 2003/0067410 A1 | 4/2003 | Puzella et al. |
| 2003/0188889 A1 | 10/2003 | Straub et al. |
| 2003/0201851 A1 | 10/2003 | Yoshida et al. |
| 2004/0217823 A1* | 11/2004 | Tayrani ............... H01P 5/10 333/26 |
| 2006/0033670 A1 | 2/2006 | Schadler |
| 2006/0044083 A1 | 3/2006 | Kuzmenka |
| 2006/0066495 A1 | 3/2006 | Isoifovich et al. |
| 2006/0214744 A1 | 9/2006 | Margomenos |
| 2006/0273864 A1* | 12/2006 | Zimmerman ........... H01P 1/184 333/161 |
| 2007/0194999 A1 | 8/2007 | Morton |
| 2009/0000804 A1 | 1/2009 | Kobayashi et al. |
| 2009/0009261 A1* | 1/2009 | Song ............... H05K 1/0253 333/128 |
| 2009/0295500 A1* | 12/2009 | Ives ............... H01P 5/16 333/128 |
| 2010/0182105 A1 | 7/2010 | Hein et al. |
| 2010/0206617 A1 | 8/2010 | Johnson et al. |
| 2010/0254094 A1 | 10/2010 | Ohhira |
| 2011/0193649 A1 | 8/2011 | Popelka et al. |
| 2013/0009729 A1 | 1/2013 | Kim |
| 2013/0154773 A1 | 6/2013 | Siprak |
| 2014/0240056 A1* | 8/2014 | Isom ............... H01P 5/10 333/26 |
| 2015/0189754 A1 | 7/2015 | Bohra et al. |
| 2015/0323576 A1 | 11/2015 | Bulja et al. |
| 2016/0079646 A1 | 3/2016 | Ichige |
| 2016/0172741 A1 | 6/2016 | Panat et al. |
| 2017/0117620 A1 | 4/2017 | Lapushin |
| 2018/0086628 A1 | 3/2018 | Vossough et al. |
| 2018/0323128 A1* | 11/2018 | Dias ............... H01L 25/0657 |
| 2019/0148807 A1 | 5/2019 | Sikina et al. |
| 2019/0150271 A1 | 5/2019 | Azadzoi et al. |
| 2019/0269007 A1 | 8/2019 | Sikina et al. |
| 2020/0028257 A1 | 1/2020 | Benedict et al. |

FOREIGN PATENT DOCUMENTS

| | | |
|---|---|---|
| CN | 206742473 U | 12/2017 |
| EP | 1202377 A2 | 5/2002 |
| EP | 1473979 A1 | 11/2004 |
| GB | 2322237 A | 8/1998 |

OTHER PUBLICATIONS

Farhan Shafique et al. "Laser machining of microvias and trenches for substrate integrated waveguides in LTCC technology", Proceedings of the 39th European Microwave Conference (2009), pp. 272-275.

Deslandes et al. "Integrated Microstrip and Rectangular Waveguide in Planar Form", IEEE Microwave and Wireless Components Letters (2001) vol. 11, No. 2, pp. 68-70.

International Search Report and Written Opinion in application No. PCT/US2018/059625 dated Mar. 4, 2019.

Leib et al. "An ultra-wideband vertical transition from microstrip to stripline in PCB technology", Proceedings of 2010 IEEE International Conference on Ultra-Wideband (2010), p. 1-4.

International Search Report and Written Opinion in application No. PCT/US2018/059240 dated Mar. 4, 2019.

Mukherjee et al. "Broadband Substrate Integrated Waveguide Cavity-Backed Bow-Tie Slot Antenna", IEEE Antennas and Wireless Propagation Letters (2014) vol. 13, p. 1152-1155.

Liu et al. "Broadband Circularly Polarized Antenna With High Gain for Ku-band Applications", IEEE Conference Proceedings (2017), p. 1-2.

Kim et al. "Slot-Coupled Circularly Polarized Array Antenna With Substrate-Integrated Waveguide Cavity for Parallel-Plate-Mode Suppression", IEEE Transactions on Antennas and Propagation (2017) vol. 65, No. 8, p. 3999-4006.

Luo et al. "Antenna Array Elements for Ka-band Satellite Communication on the Move", Loughborough Antennas & Propagation Conference (2013), p. 135-139.

Beeresha et al. "Embedded Microstrip Line to Stripline Vertical Transition Using LTCC Technique", International Journal of Research in Engineering and Technology (2015) vol. 4, Issue 12, pp. 30-34.

Shan et al. "A Compact Broadband Stripline-fed Slot Antenna for Array Application", IEEE International Workshop on Antenna Technology (2005), pp. 555-558.

International Search Report and Written Opinion in application No. PCT/US2018/059602 dated Apr. 18, 2019.

Hong et al. "Grid Assembly-Free 60-GHz Antenna Module Embedded in FR-4 Transceiver Carrier Board", IEEE Transactions on Antennas and Propagation (2013) vol. 61, No. 4, pp. 1573-1580.

Invitation to Pay Additional Fees in application No. PCT/US2018/059410 dated Apr. 23, 2019.

International Search Report and Written Opinion in application No. PCT/US2018/059841 dated Mar. 4, 2019.

Sitaraman et al. "Modeling, Design and Demonstration of Integrated Electromagnetic Shielding for Miniaturized RF SOP Glass Packages", Electronic Components & Technology Conference (2015), p. 1956-1960.

International Search Report in application No. PCT/US2019/019851 dated May 29, 2019.

Jung et al. "Inkjet-printed resistors with a wide resistance range for printed read-only memory applications", Organic Electronics (2013) vol. 14, pp. 699-702.

Kim et al. "Fabrication of Fully Inkjet-Printed Vias and SIW Structures on Thick Polymer Substrates", IEEE Transactions on Components, Packaging and Manufacturing Technology (2016) vol. 6, No. 3, pp. 486-496.

International Search Report and Written Opinion in application No. PCT/US2019/019847 dated Apr. 29, 2019.

(56) References Cited

OTHER PUBLICATIONS

Kangasvieri et al. "An Ultra-Wideband BGA-Via Transition for High-Speed Digital and Millimeter-Wave Packaging Applications", IEEE (2007), pp. 1637-1640.
Bailey, M. "General Layout Guidelines for RF and Mixed-Signal PCBs", Maxim Integrated (2011), pp. 1-10. Retrieved from URL: <<https://pdfserv.maximintegrated.com/en/an/AN5100.pdf>>.

* cited by examiner

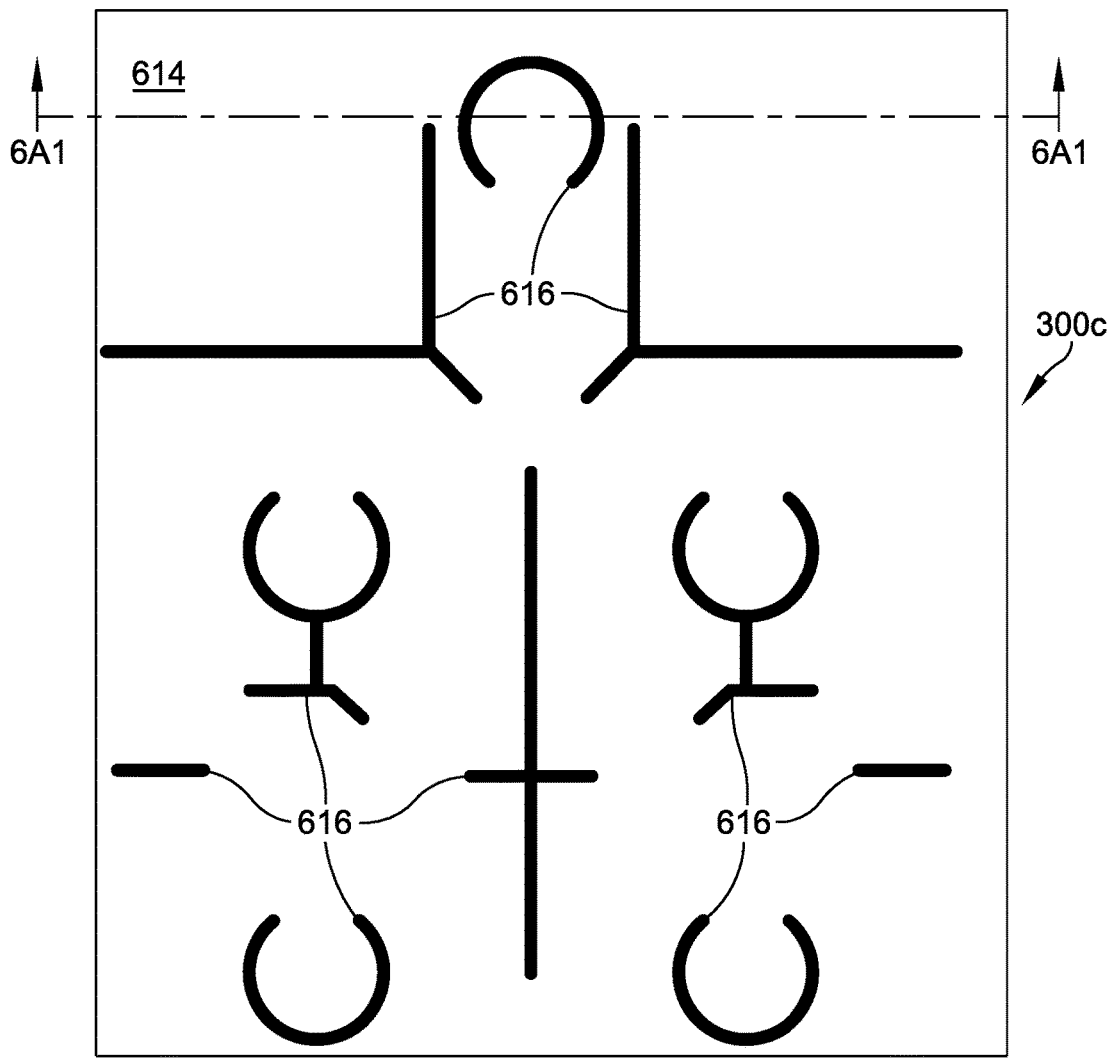
FIG. 6A
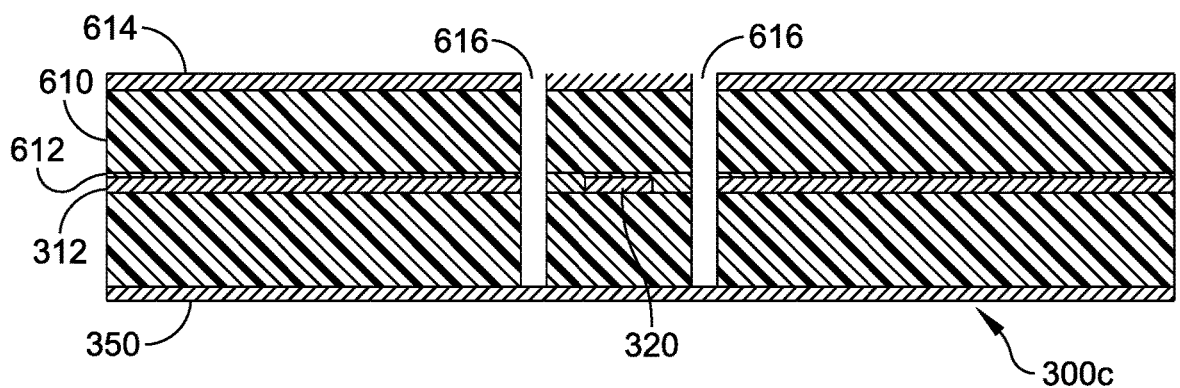
FIG. 6A1

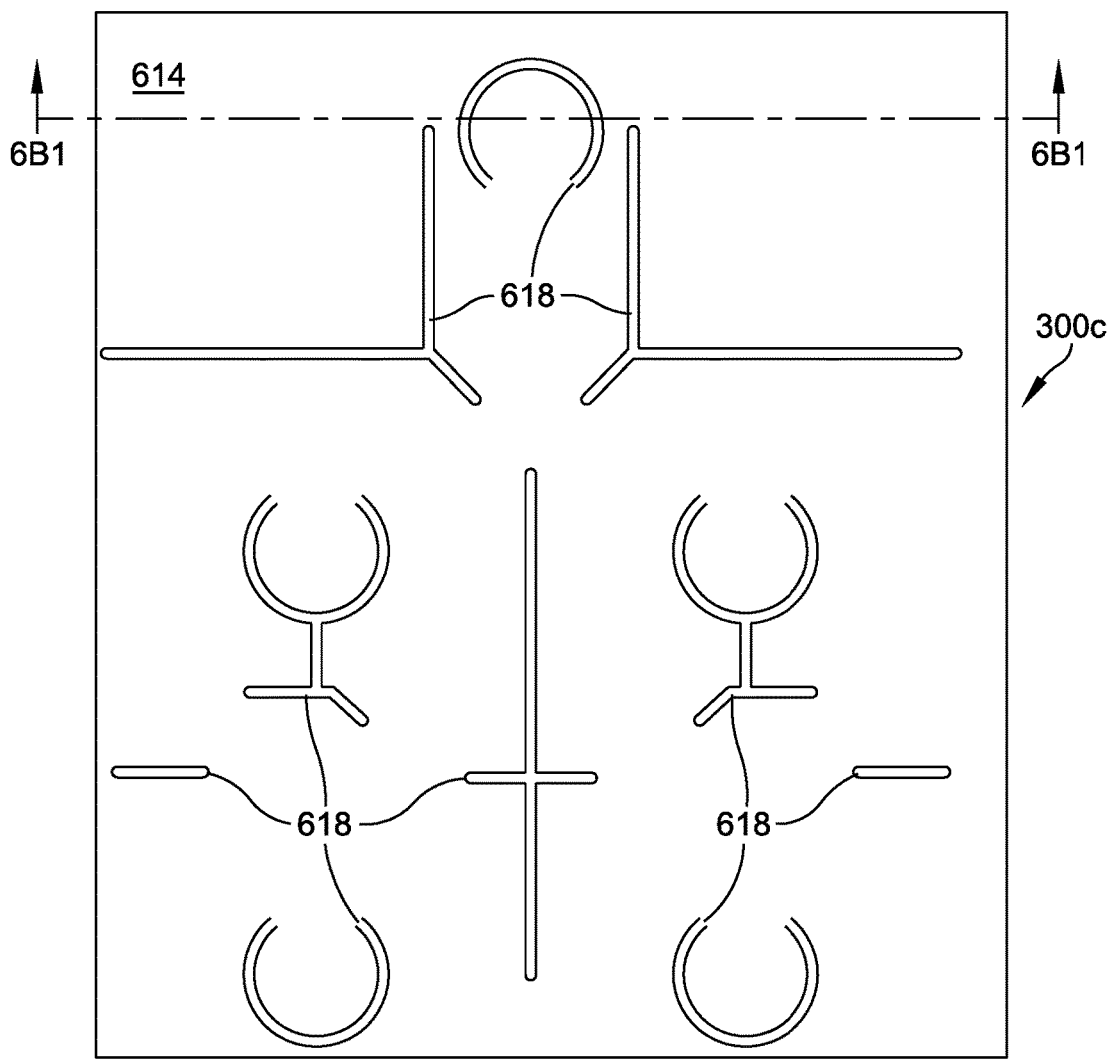
FIG. 6B
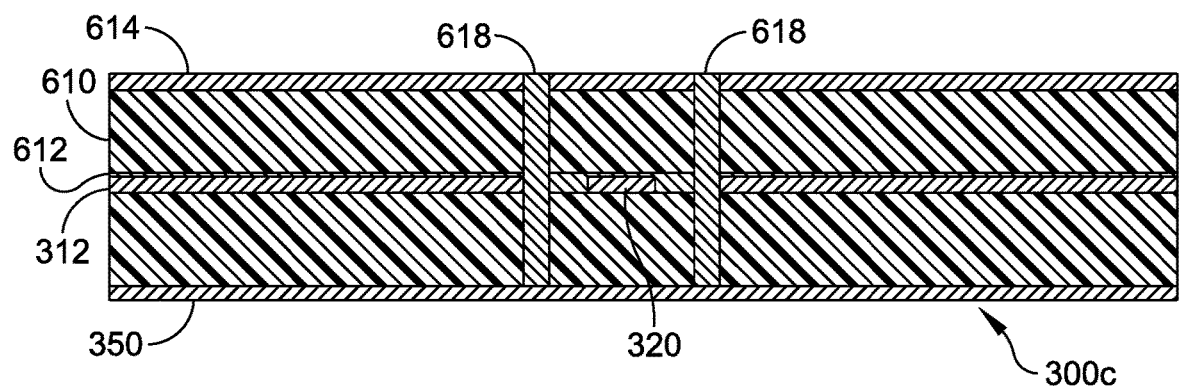
FIG. 6B1

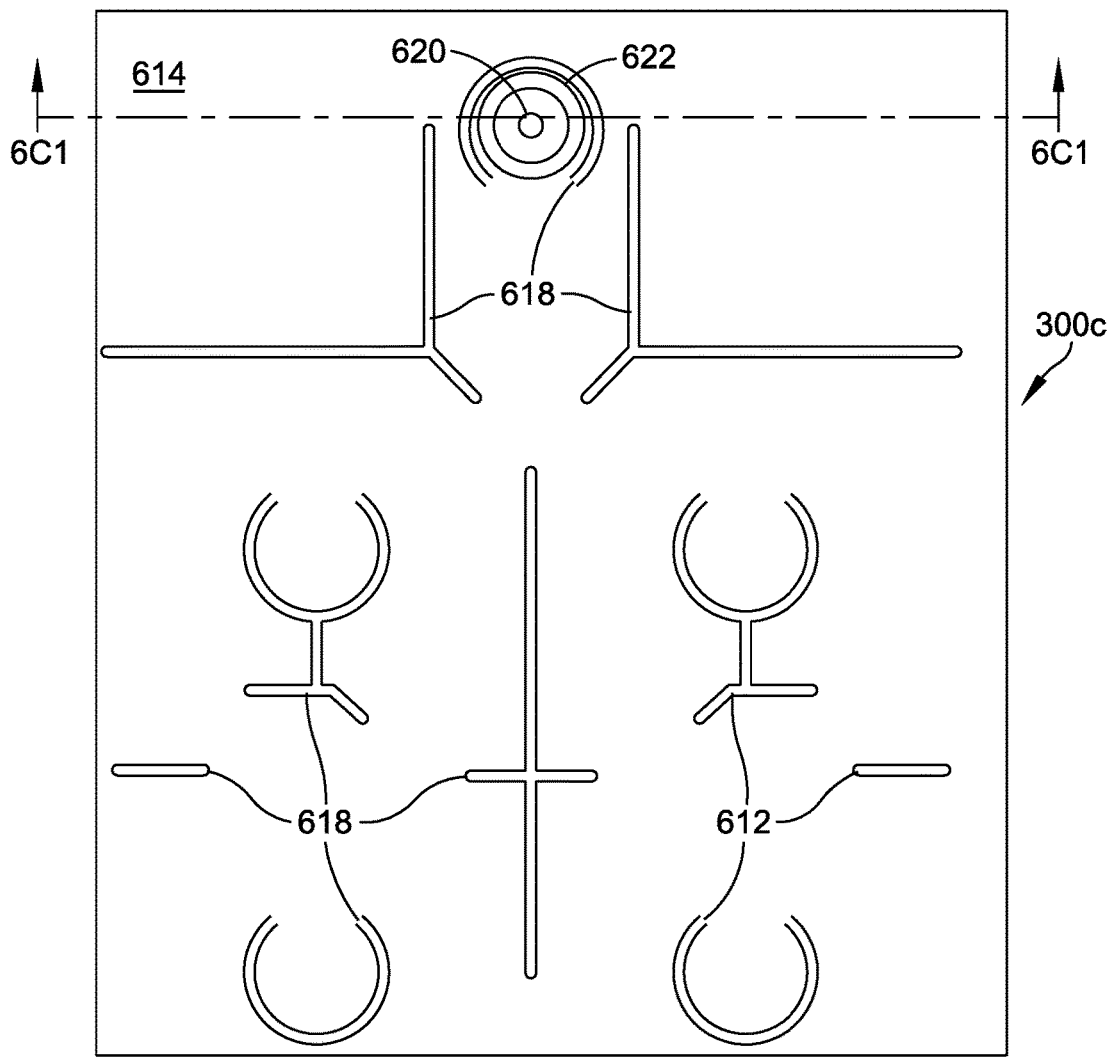
FIG. 6C
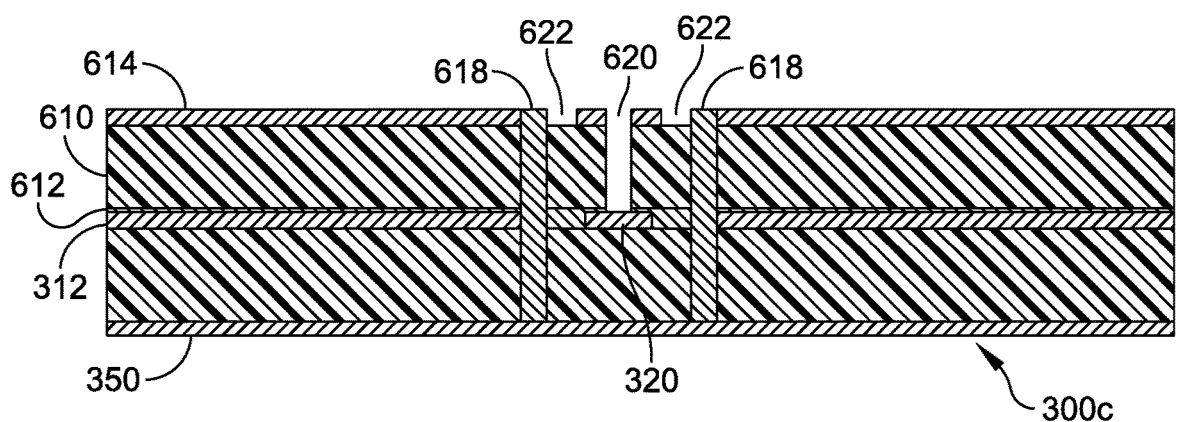
FIG. 6C1

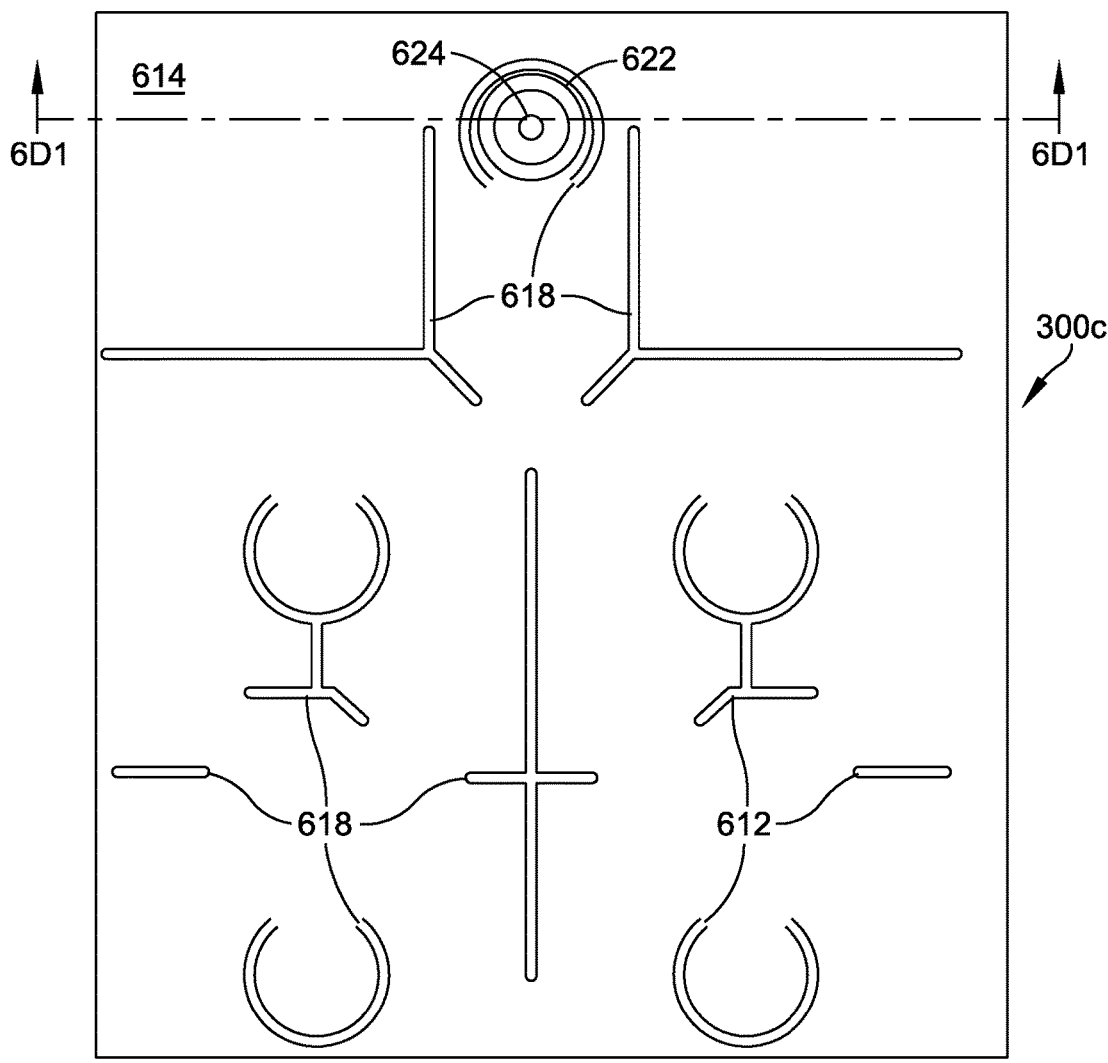
FIG. 6D
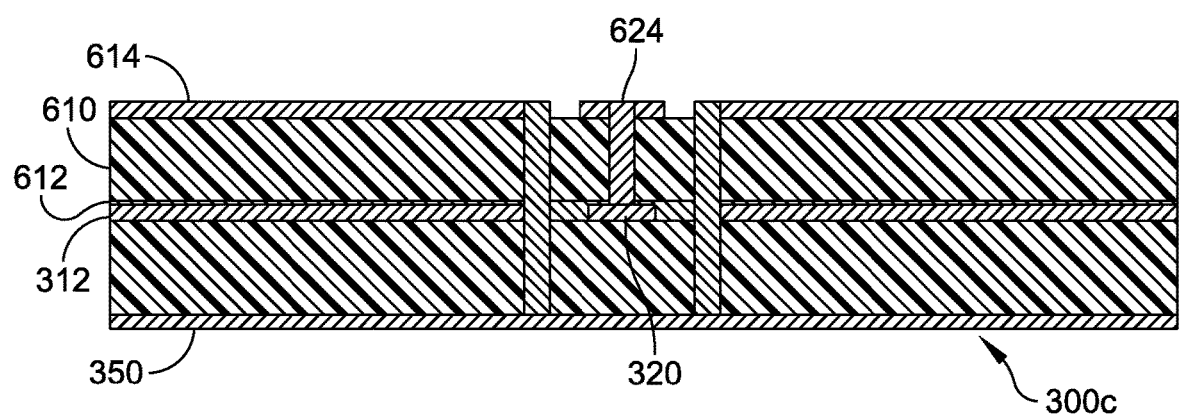
FIG. 6D1

ADDITIVE MANUFACTURING TECHNOLOGY (AMT) LOW PROFILE SIGNAL DIVIDER

CROSS-REFERENCE TO RELATED APPLICATIONS

This application claims priority to U.S. Provisional Patent Application No. 62/636,375 filed Feb. 28, 2018, entitled ADDITIVE MANUFACTURING TECHNOLOGY (AMT) LOW PROFILE SIGNAL DIVIDER, which is incorporated by reference herein in its entirety.

BACKGROUND

Radio frequency (RF) and electromagnetic power dividers (power splitters) may be manufactured for use in, or as part of, an RF circuit and in some cases may be disposed upon a printed circuit board (PCB) using conventional PCB manufacturing processes. Lamination, electroplating, masking, etching, and other process steps may require multiple steps, expensive and/or hazardous materials, multiple iterations, extensive labor, etc., all leading to higher cost and slower turnaround time. Additionally, conventional PCB manufacturing processes have limited ability to allow for small feature sizes, such as signal trace dimensions, that limit the range of highest frequency signals that can be supported by such devices.

SUMMARY

One aspect of the present disclosure is directed a method of manufacturing a power divider circuit. In one embodiment, the method comprises: milling a conductive material disposed upon a first substrate to form a signal trace, the signal trace including a division from a single trace to two arm traces, each of the two arm traces having a proximal end electrically connected to the single trace and a distal end electrically connected to each of two secondary traces; depositing a resistive ink between the two distal ends to form a resistive electrical connection between the two arm traces; bonding a second substrate to the first substrate to substantially encapsulate the traces between the first substrate and the second substrate; and milling through at least one of the first substrate or the second substrate to provide access to at least one of the traces.

Embodiments of the method further may include milling the conductive material to form at least one pad electrically connected to the signal trace. The method further may include depositing a solder bump on the at least one pad. Milling through at least one of the first substrate or the second substrate to provide access to at least one of the traces may include milling through the second substrate to the solder bump, to provide access to the solder bump. The method further may include inserting a conductive wire in the milled access to the solder bump, and reflowing the solder bump to secure the conductive wire to the at least one pad. The method further may include milling through both of the second substrate and the first substrate to form a trench, and depositing a conductive ink into the trench.

Another aspect of the present disclosure is directed to a signal divider comprising one or more substrates and a plurality of signal traces disposed on a surface of one of the one or more substrates and configured to provide matched impedances at three ports. A signal is received at a first of the three ports being divided substantially equally and provided to a second and third of the three ports. Signals received at the second and third of the three ports are combined and provided to the first of the three ports. The signal divider further comprises a resistive element formed of a resistive ink coupling the second and third of the three ports.

Embodiments of the signal divider further may include two substrates and the plurality of signal traces is disposed between the two substrates. The signal divider further may include one or more milled trenches through the two substrates, with the milled trenches being filled with a conductive ink to form substantially electrically continuous structures configured to shield electromagnetic energy. The total thickness may be 10 mils or less. The signal divider further may include four output ports fed by additional signal traces, with the additional signal traces coupled to the second and third of the three ports. The additional signal traces may be configured to divide signals received from each of the second and third of the three ports to provide substantially equal divided signals to each of the four output ports. One or more substrates may have a combined total thickness less than 13 mils.

Yet another aspect of the present disclosure is directed to a signal divider comprising two substrates bonded together and having a total thickness less than 13 mils and a plurality of signal traces disposed between the two substrates and configured to provide matched impedances at three ports. A signal received at a first of the three ports is divided substantially equally and provided to a second and third of the three ports. Any signals received at the second and third of the three ports are combined and provided to the first of the three ports. The signal divider further comprises one or more milled trenches through the two substrates, with the milled trenches being filled with a conductive ink to form substantially electrically continuous structures configured to shield electromagnetic energy.

Embodiments of the signal divider further may include a resistive element formed of a resistive ink coupling the second and third of the three ports. The two substrates may have a total thickness less than 13 mils.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. In the figures:

FIGS. 6A-6E are schematic diagrams of one example of a manufacturing progression of an electromagnetic circuit, such as any of the signal dividers of FIGS. 3-5.

DETAILED DESCRIPTION

Figure 1:
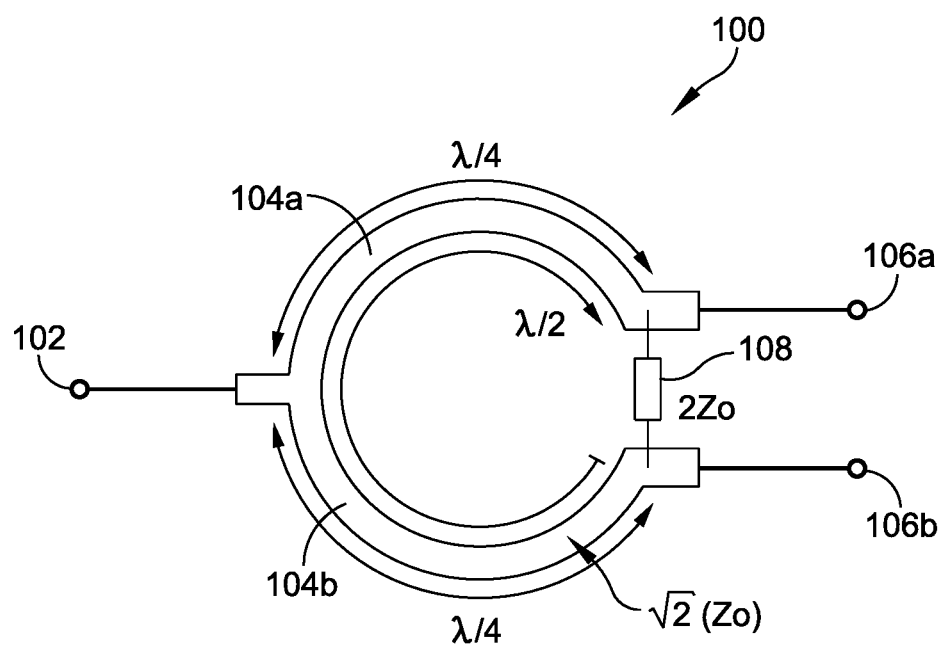
FIG. 1 is a schematic diagram of one example of a signal divider circuit.

Various aspects and embodiments are directed to compact, low profile power dividers for electromagnetic circuits, and improved methods of manufacture of the same, that allow for small sizes and higher frequencies than conventional systems and methods.

Still other aspects, examples, and advantages are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Various aspects and embodiments described herein may include means for performing any of the described methods or functions.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

The term "radio frequency" as used herein is not intended to refer to any particular frequency, range of frequencies, bands, spectrum, etc., unless explicitly stated and/or specifically indicated by context. Similarly, the terms "radio frequency signal" and "electromagnetic signal" are used interchangeably and may refer to a signal of any frequency. Additionally, the terms splitter, signal splitter, power splitter, divider, signal divider, and power divider may be used interchangeably to refer to any apparatus the splits or divides a common signal into two substantially identical signals, each typically of equal power that is half the power of the original common signal. In many cases, a signal divider may sufficiently operate as a signal combiner, to combine two signals into one, when used in the opposite direction as its dividing operation. In some cases, such a divider/combiner may provide a splitting functionality for a signal traveling in one direction simultaneously with providing a combining functionality for signals traveling in a second (e.g., reverse) direction. It should be appreciated that various embodiments of radio frequency circuits, including signal splitters and combiners, may be designed with dimensions selected and/or nominally manufactured to operate at various frequencies. The selection of appropriate dimensions may be had from general electromagnetic principles and are not presented in detail herein. The methods and apparatuses described herein may support smaller arrangements and dimensions than conventionally known, and may allow or accommodate the manufacture of electromagnetic circuits of smaller dimensions than conventionally known, and thereby may be particularly suitable for radio frequency circuits intended to be operated at higher frequencies.

FIG. 1 illustrates an electromagnetic circuit 100, which is a conventional two port Wilkinson divider, having an input port 102 that feeds two quarter-wave arms 104, each of which feeds one of two output ports 106. The two arms 104 are coupled by a resistance 108 at the output side of the divider 100. The signal divider 100 is symmetrical and works equally well as a signal combiner, to receive each of two signals at the output ports 106, respectively, and provide a combined signal at the input port 102. Accordingly, the designations of "input" and "output" are with respect to the circuit 100 used as a divider, while use as a combiner (with reversed "input" and "output" designations) is equally valid.

Figure 2:
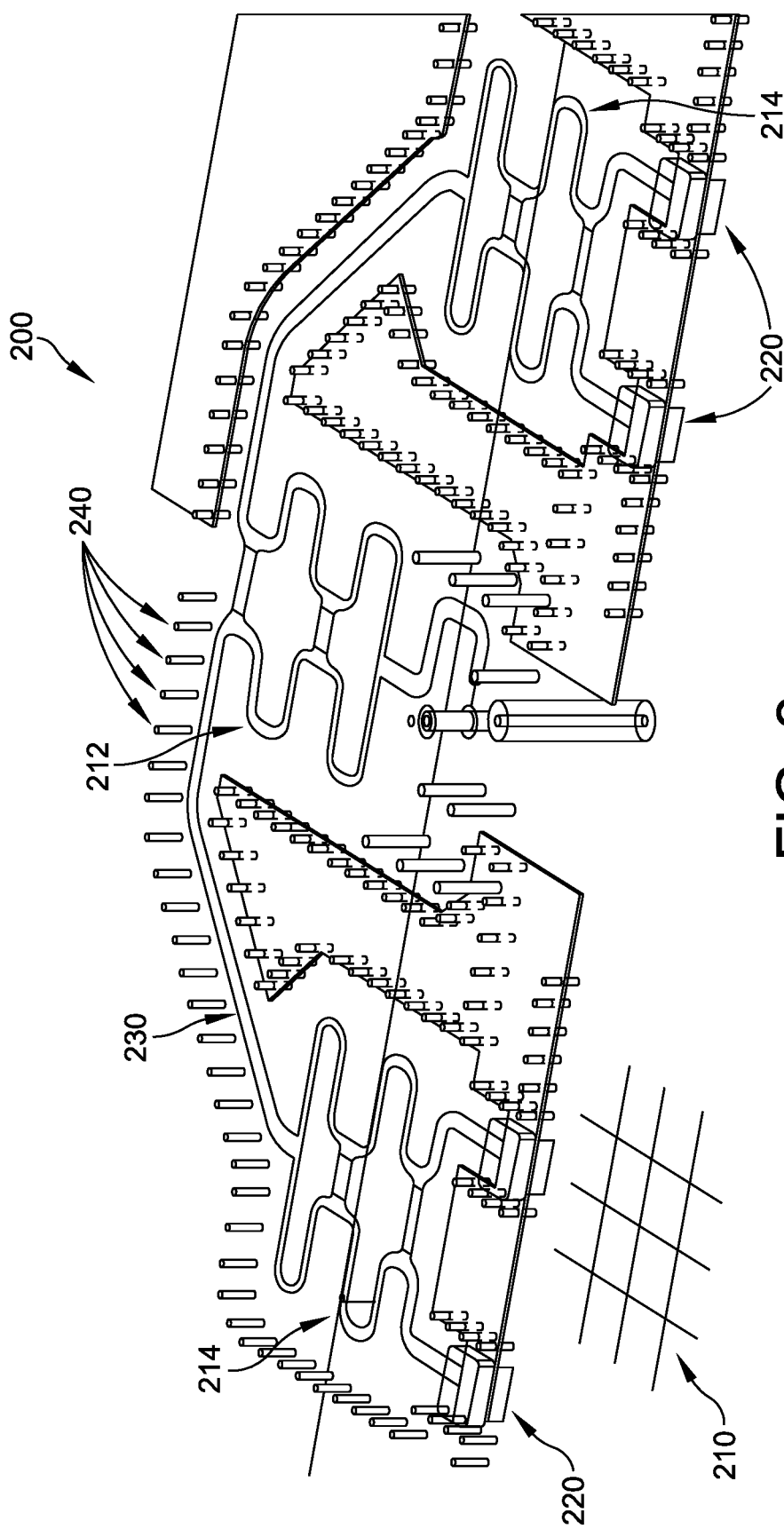
FIG. 2 is a schematic diagram of one example of a manufactured embodiment of a signal divider.

FIG. 2 illustrates an example of a conventional manufacture of a signal dividing circuit 200. The circuit 200 is generally disposed on a surface 210 (e.g., a planar surface) of a substrate, and a substrate may exist both above and below the surface 210, though such are transparent in FIG. 2 to allow visual clarity of various conductors, etc. The circuit 200 is an embodiment of a 4:1 splitter, having a first splitter 212 that splits a common signal into a pair of signals, each of which feeds one of two subsequent splitters 214 that further split each of the pair of signals into two further signals, thus providing four signals, one at each of four output ports 220. Electromagnetic signals are conveyed through the splitters 212, 214 along electrically conductive traces 230 that may have been formed from, e.g., a conventional PCB process of laminate deposition, masking, etching, etc. Conventional PCB manufacturing imposes limitations on the width of traces 230, thus limiting the highest frequencies for which conventionally made electromagnetic circuits may be suitable. Further, substrate thicknesses impact characteristic impedance (e.g., due to the distance to ground planes disposed upon opposing surfaces) in relation to width of the traces 230. Accordingly, wider traces 230 required by conventional PCB processes cause selection of thicker substrates (to maintain a particular characteristic impedance), thus limiting how thin the circuit 200 can be manufactured. For example, general recommendations under conventional PCB manufacturing include total thicknesses of about 60 mil (0.060 inches). By comparison, electromagnetic circuits in accord with aspects and embodiments described, using additive manufacturing techniques, can result in signal dividers having a low profile down to a thickness of about 10 mil or less, with signal line traces having widths of about 4.4 mil, or 2.7 mil, or less.

Also shown in FIG. 2 are ground vias 240 that conventionally provide electrical connectivity between ground planes (e.g., on opposing surfaces of substrates) and provide some isolation of signals on the traces 230 from other traces that may be nearby. The conventional ground vias 240 are drilled holes of about 8 mil diameter or greater, and are required to be a minimum distance apart to maintain structural integrity of the board. Accordingly, ground vias 240 are leaky structures, exhibiting loss of electromagnetic signal, especially at higher frequencies. As various applications require support for higher frequency signals, the minimum spacing between ground vias act like large openings through which relatively small wavelengths of electromagnetic energy may escape.

By comparison, electromagnetic circuits and methods in accord with aspects and embodiments described herein, which use additive manufacturing techniques, allow for electrically continuous structures to connect ground planes. Accordingly, an electrically continuous structure is provided and disposed vertically through one or more substrates, (e.g., between opposing surfaces of the substrate) to form "Faraday walls" that confine electric fields. In various embodiments, such Faraday walls may electrically couple two or more ground planes. Further in various embodiments, such Faraday walls may confine and isolate electromagnetic fields form neighboring circuit components. In some embodiments, such Faraday walls may enforce a boundary condition to limit electromagnetic signals to be locally transverse electric-magnetic (TEM) fields, e.g., limiting signal propagation to a TEM mode.

Electromagnetic circuits and methods of manufacture in accord with those described herein include various additive manufacturing techniques to produce electromagnetic circuits and components capable of handling higher frequencies, with lower profiles, and at reduced costs, cycle times, and design risks, than conventional circuits and methods. Examples of techniques include milling of conductive material from a surface of a substrate to form signal traces or apertures of significantly smaller dimensions than allowed by conventional PCB processes, milling of one or more substrates to form a trench, using 3-dimensional printing techniques to deposit printed conductive inks into the trench to form a Faraday wall (a continuous electric barrier, as opposed to a series of ground vias with minimum spacing therebetween), "vertical launch" signal paths formed by milling (drilling) a hole through a portion of substrate and in which a wire is placed (and/or conductive ink is printed), to make electrical contact to a signal trace disposed on a surface of the substrate (or an opposing substrate), which may include forming a Faraday wall around the vertical launch conducting wire (which may be copper in some embodiments), and using 3-dimensional printing techniques to deposit printed resistive inks to form resistive components. Any of the above example techniques and/or others (e.g., soldering and/or solder reflow), may be combined to make various electromagnetic components. Aspects and examples of such techniques are described and illustrated herein with respect to a signal divider circuit, e.g., suitable for use as a beamformer to distribute an electromagnetic signal to multiple radiators of an array, for example, but the techniques described may be used to form various electromagnetic components, connectors, circuits, assemblies, and systems.

Figure 3:
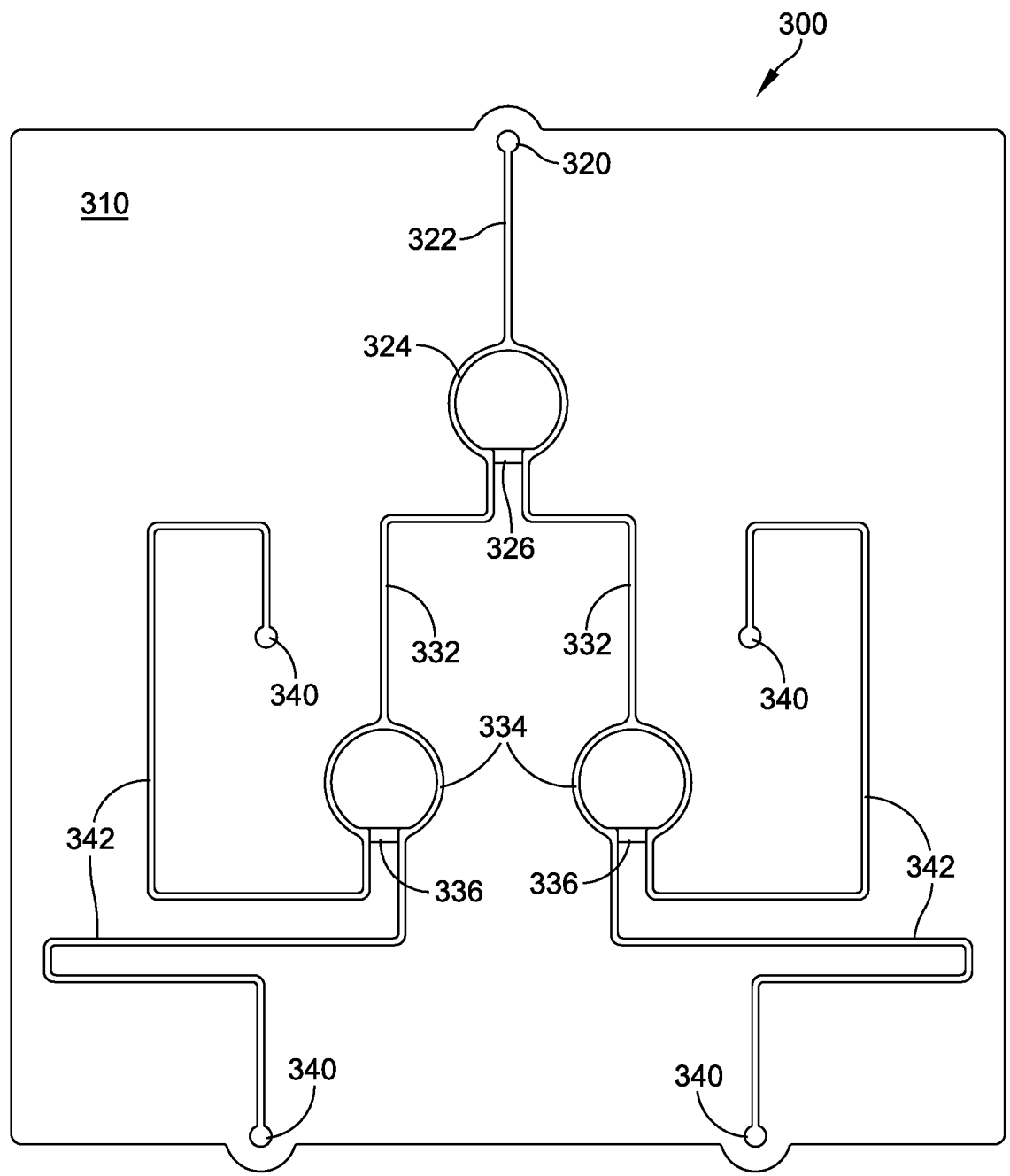
FIG. 3 is a schematic diagram of one example of a signal divider circuit in accord with aspects and embodiments herein.

FIG. 3 shows a structure 300 of an example of a signal divider in accord with aspects and embodiments of the systems and methods described herein. The structure 300 is a substrate having a surface 310 upon which is disposed a conductive material, such as electroplated copper, for instance, that has been milled away (e.g., subtracted) to form various electrically conductive features. The features created by milling are described with respect to their function when in operation, which in this example is to implement a 4-way splitter, thus including one input 320 and four outputs 340.

The input 320 may be formed as a pad, and may receive a signal which is conveyed via a line 322 to feed a first splitter 324 that divides the signal across two arms and provides half the signal to each of two further lines 332, each of which feeds one of two second splitters 334, each having two arms themselves to split the signal each receives into two further signal portions, yielding four substantially equal signal portions from the original signal received at the input 320. Each of the four signal portions is conveyed along one of four further lines 342 to one of the four outputs 340, each of which also may be formed as a pad.

Accordingly, the electrical features formed from the conductive material are formed by milling away the conductive material from a portion of the surface 310. Additionally, a resistor 326 is printed from resistive ink (additive manufactured), by one or more applications or depositions of resistive ink to build up the resistor 326 to an appropriate resistive value so that the first splitter 324 nominally functions as a Wilkinson divider. Similarly, resistors 336 are printed from resistive ink (additive manufactured), by one or more applications or depositions of resistive ink to provide an appropriate resistive value so that each of the second splitters 334 nominally functions as a Wilkinson divider.

In various embodiments, a structure 300 may include an opposing surface (e.g., below the surface 310, set a distance away from the surface 310 by a thickness of a substrate), and disposed on the opposing surface there may be a further conductive material, which may be left substantially intact to form a ground plane with respect to the electrical features disposed on the surface 310.

Figure 4:
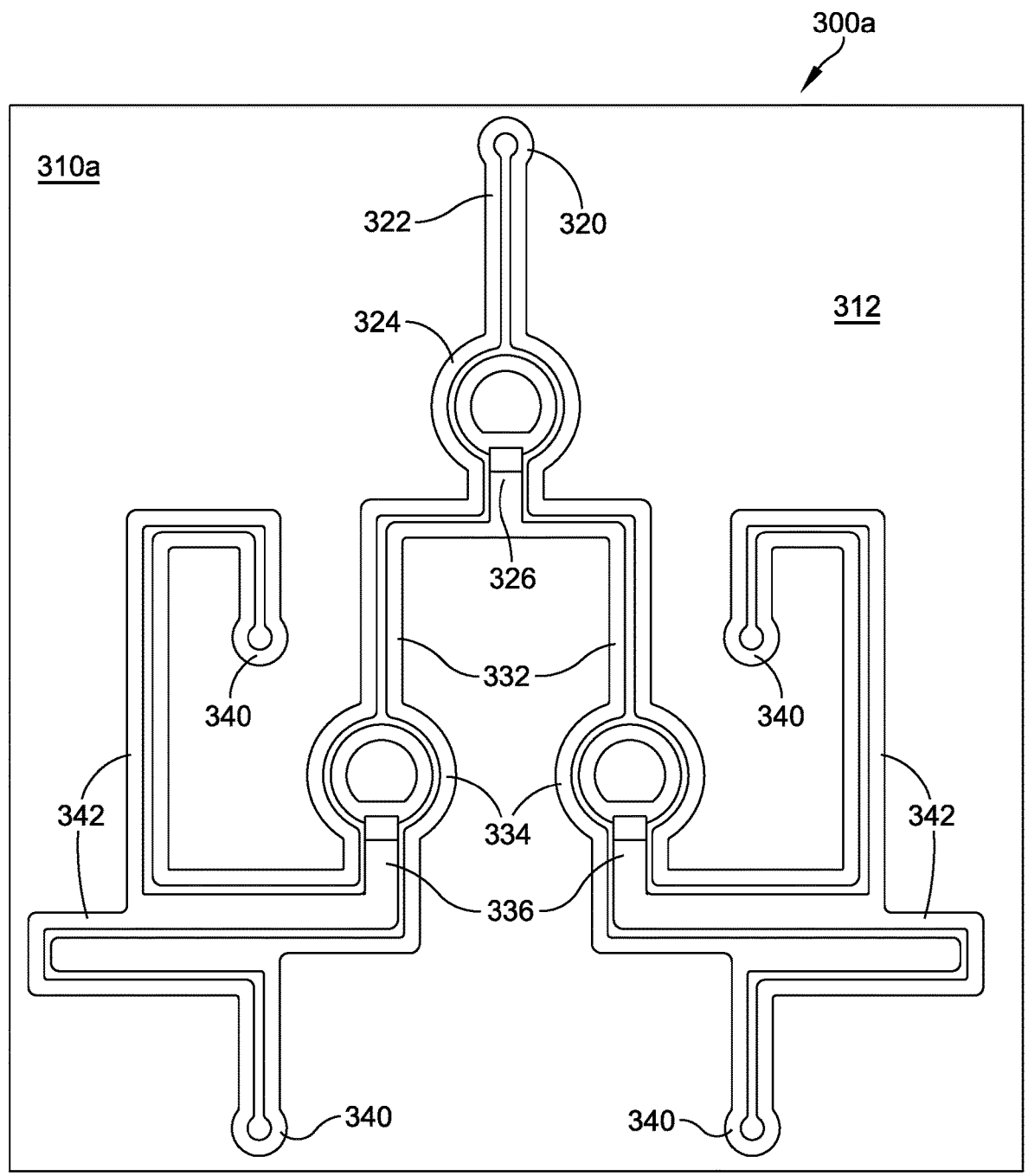
FIG. 4 is a schematic diagram of another example of a signal divider circuit in accord with aspects and embodiments herein.

FIG. 4 illustrates another structure 300a of an example of a signal divider in accord with aspects and embodiments of the systems and methods described herein. The structure 300a is similar to the structure 300 of FIG. 3, including a substrate having a surface 310a upon which is disposed a conductive material, with portions milled away to form the various electrically conductive features. In the example of the structure 300a, however, conductive material has been milled away adjacent to the various features, to form part of the features, but otherwise left intact at other regions of the surface 310a, thus forming a lateral ground plane 312, which may act to contain electromagnetic signals conveyed by the various electrically conductive features. In some embodiments, a further conductive material may be disposed upon an opposing surface, e.g., below the surface 310a, to form a ground plane "below" the surface 310a and the electrically conductive features disposed thereon.

Figure 5:
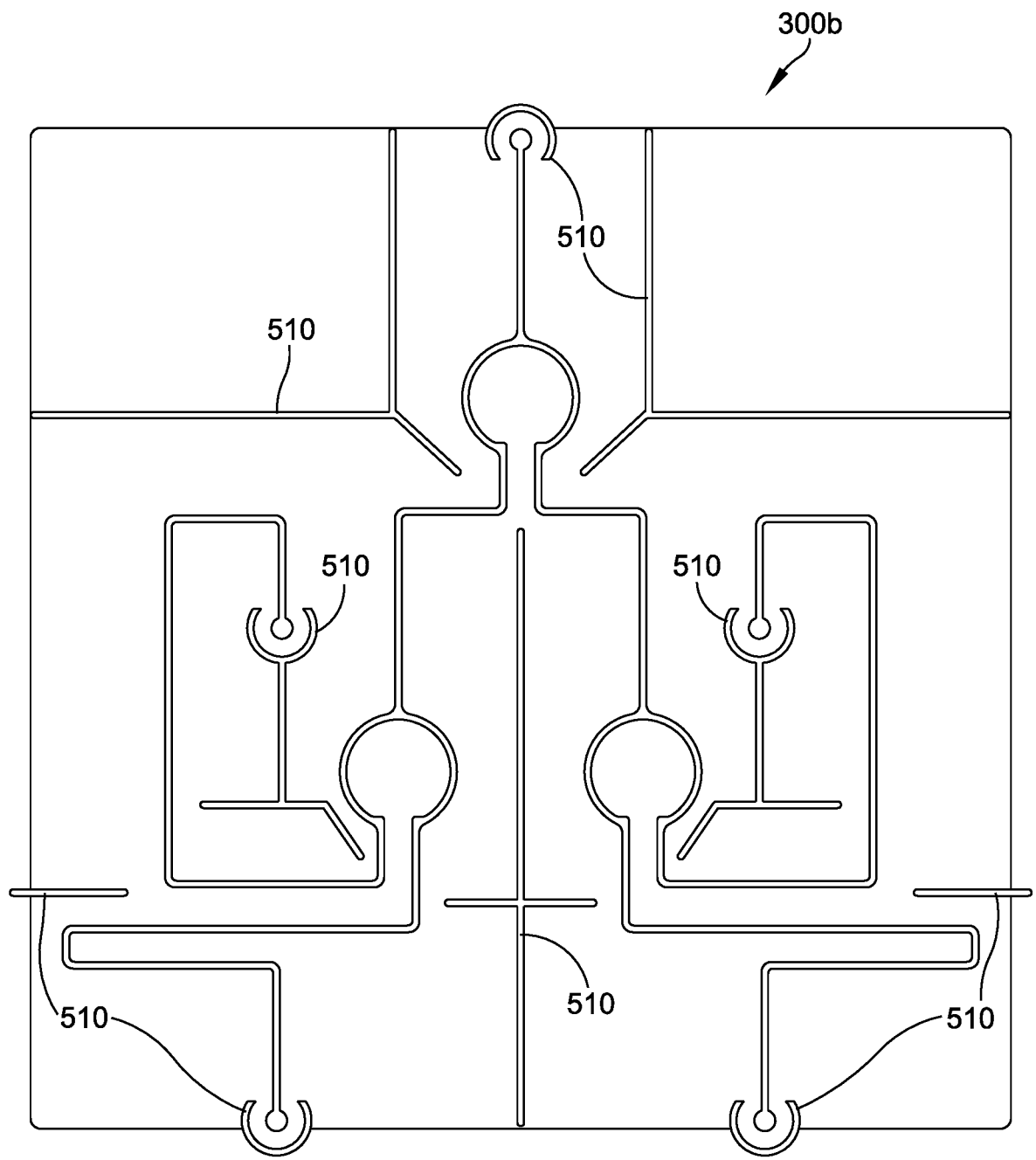
FIG. 5 is a schematic diagram of another example of a signal divider circuit in accord with aspects and embodiments herein.

FIG. 5 illustrates another structure 300b of an example of a signal divider in accord with aspects and embodiments of the systems and methods described herein. The structure 300b is similar to the structure 300 of FIG. 3, including a substrate having a surface with portions of conductive material milled away to form the various electrically conductive features. Additionally shown in FIG. 5 is an example set of locations of Faraday walls 510. The Faraday walls 510 are conductive material that pass through the substrate, as discussed in more detail below, that force boundary conditions in the substrate to confine and isolate electromagnetic fields, e.g., from interacting between the various electrically conductive features. The Faraday walls 510 may be formed, in some embodiments, by milling through a substrate (e.g., normal to and into the page of the figure), to an opposing surface of the substrate, preferably without piercing through any conductor disposed on the opposing surface. The milling process thereby forms trenches within which the Faraday walls 510 are deposited, by additive manufacturing (e.g., printing) of a conductive material, e.g., a conductive ink.

In some embodiments, one or more additional substrates may be provided to protect the signal divider circuit, to enhance the overall structural integrity of the structure, and/or to provide additional circuit elements or connectivity to other circuit elements (e.g., a phase shifting circuit, a radiating element, etc.). With reference to FIGS. 6A and 6A1, a further structure 300c is a further example of a signal divider in accord with aspects and embodiments of the systems and methods described herein. The structure 300c is similar to the structures 300, 300a, 300b, as previously described, having a conductive material 312 disposed on the surface of a substrate, along with a further conductive material 350 disposed upon an opposing surface of the substrate, which may form a ground plane in some embodiments. Electrically conductive features are milled into the conductive material 312, including, for example, the input 320, shown in FIG. 6A1 in cross section. Additionally, resistors 326, 336 are deposited through additive manufacturing (e.g., printing of resistive ink) to be disposed on the surface of the substrate, as shown in FIGS. 3 and 4, for example. As illustrated in FIG. 6A, a further substrate 610 may be adhered (e.g., bonded) with a bonding material 612. In some embodiments, the substrate 610 may have a further conductive material 614 disposed upon a surface, e.g., the surface of the substrate 610 opposing the bonded surface in contact with the bonding material 612.

With continued reference to FIGS. 6A and 6A1, the electrically conductive features of the signal divider circuit (see, e.g., FIG. 4) are not visible from the top view because those features are embedded "below" the substrate 610. However, trenches 616 are illustrated from both the cross sectional and the top view, and may be formed in various embodiments by milling through the substrates down to the conductive material 350. The conductive material 350 may, in some embodiments, act as a continuous ground plane and/or may provide structural support to the structure 300c, in which case the trenches 616 may preferably go to the conductive material 350 without piercing the conductive material 350. In various embodiments, some trenches 616 may pierce the conductive material 350, depending upon various applications.

FIGS. 6B and 6B1 illustrate the structure 300c with conductive fill 618 deposited into the trenches 616. The conductive fill 618 may be a conductive material or conductive ink deposited by additive manufacturing (e.g., 3-D printing) techniques. The conductive fill 618 substantially fills the trenches 616 to form Faraday walls, such as the Faraday walls 510 illustrated in FIG. 5, for example.

Access to the input 320 may be had, in various embodiments, by drilling (e.g., milling) through the substrate 610 to the input 320, thereby forming a hole 620 with access to the input 320, as shown in FIGS. 6C and 6C1. Drilling the hole 620 may be performed before or after milling the trenches 616, or in the same process step. Further, drilling the hole 620 may be performed before bonding with the bonding material 612. According to various embodiments, milling, bonding, and filling steps may be performed in various ways and in various orders of operation while remaining in keeping with the aspects and embodiments of systems and methods described herein, depending upon the application. Further, milling, bonding, and filling as described variously herein may be automated by a milling machine, 3-D printer, etc., in near proximity, with various robotic handling and/or alignment in some cases, and may enable rapid prototyping of electromagnetic components, elements, circuits, and systems.

In some embodiments, access to the input 320 (or any other feature of the circuit embedded between the substrates) may be facilitated by a deposit of solder placed on the, e.g., input 320 prior to bonding the substrate 610. Further in the example shown in FIGS. 6C and 6C1, a further milling is performed to remove some of the conductive material 614 around the hole 620, to form an electrical disconnection 622.

As discussed above, the hole 620 provides access to the input 320. Similar holes may be placed to provide access to the output ports 340 (see, e.g., FIG. 4). In some embodiments, access to one or more of the output ports 340 may be made through a different surface than the input 320. For example, in various embodiments, a hole may be milled through the conductive material 350 (and the underlying substrate upon which it is disposed) to access an output 340 from a "bottom" side of the structure 300c, depending upon application, such as an intended use for any signals provided at any of the output ports 340 or the input 320.

Figure 6E:
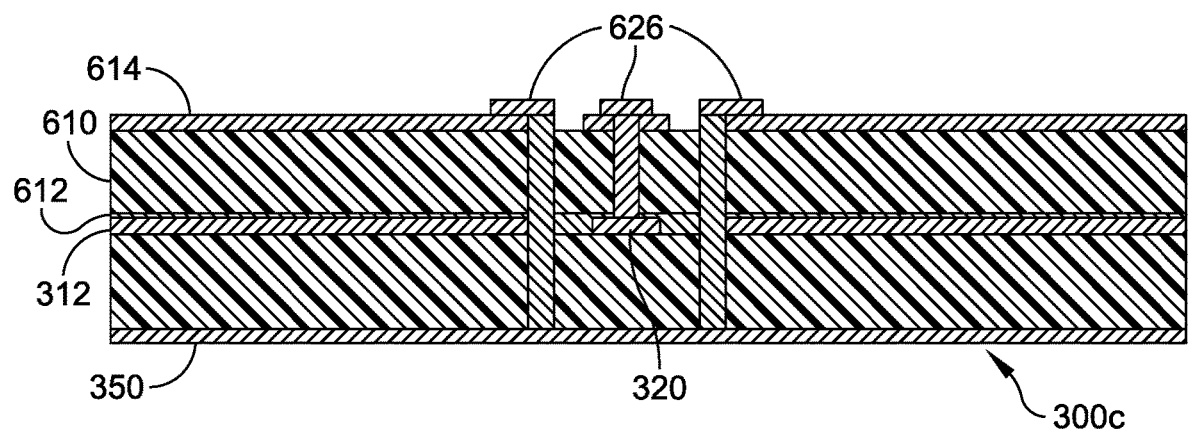

To convey a signal to or from the input 320, for example, additional conducting material(s) may be provided, such as by filling (depositing) conductive material or conductive ink in the hole 620 in some embodiments, or by inserting a conductor 624 into the hole 620, as illustrated in FIGS. 6D and 6D1. The conductor 624 may be a solid conductor in some embodiments, such as a wire, and in some embodiments the conductor 624 may be a copper wire. In various embodiments, other conductive materials may be suitable depending upon the application. Further, a wire may be of round, square, or other cross-sectional shapes, and may be solid or hollow cored in various embodiments. In some embodiments, and as shown in FIG. 6E, one or more solder bumps 626 may be placed on the conductor 624 and/or the conductive fill 618 that forms Faraday walls. In the case of the instant example of Faraday walls, they may be electrically connected to the conductive material 614 disposed on the surface of the substrate 610, which may form a ground plane in various embodiments. In some embodiments, a solder reflow operation may be included to adhere the solder bumps 626 to their respective electrical features. In some embodiments, as discussed above, a solder bump may be provided on the input 320, and a solder reflow operation may adhere the conductor 624 to the input 320 via the solder bump. Various solder reflow operations may be conducted simultaneously or at different times, depending upon circumstance, circuit design, application and/or available manufacturing equipment.

In some embodiments, a connector, such as a coaxial connector, may be coupled to the solder bumps 626 to allow signal connectivity to other components, circuits, cables, etc. In some embodiments, a further structure may be provided and coupled (e.g., via its own solder bumps) to the solder bumps 626 to allow signal connectivity. Such a further structure may be similar to that of the structure 300c, in some instances. Such a further structure may couple to the solder bumps 626 by solder reflow to substantially permanently couple the further structure (e.g., a further electromagnetic circuit). In other embodiments, a further structure may couple to the solder bumps 626 by compression or pressure, such as with a fastener, magnet, etc., and such coupling may include alignment features, such as a pin, bump, magnet, etc. In other embodiments, one or more additional substrates may be bonded and the hole 620 may be drilled through the additional substrates, and the conductor 624 may be long enough to extend through the additional substrates. In various embodiments, the conductor 624 may be terminated or coupled to other circuit features in different ways, such as by coupling to a signal trace disposed on the surface of a different substrate, for example.

In various embodiments, various subtractive (milling, drilling), additive (printing, filling), and adherent (bonding) steps may be carried out, in various orders, with soldering and reflow operations as necessary, to form an electromagnetic circuit having one or any number of substrate layers, of which a signal divider is merely one example.

Figure 7:
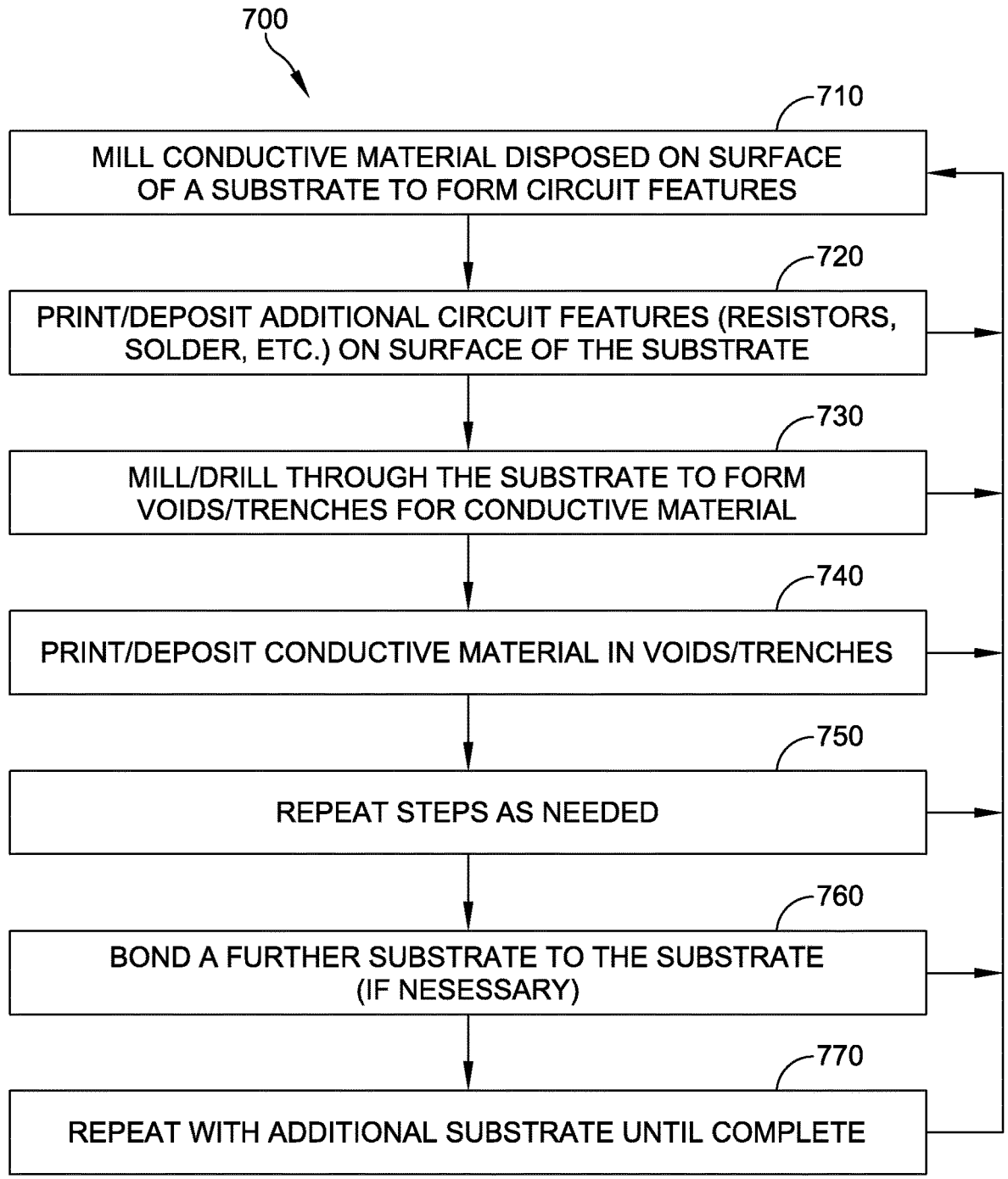
FIG. 7 is a flow diagram of an example of a method of manufacturing an electromagnetic circuit, such as any of the signal dividers of FIGS. 3-5 or the electromagnetic circuit(s) of FIGS. 6A-6E.

A generalized method for making any of various electromagnetic circuits is illustrated with reference to FIG. 7. The method 700 includes milling a conductive material disposed on a substrate (block 710) to form circuit features, such as those illustrated in FIGS. 3-5. The method 700 also includes printing (or depositing, e.g., via 3-D printing, additive manufacturing techniques) additional circuit features (block 720), such as the resistors 326, 336 of FIGS. 3 and 4, for example. The method 700 may include depositing solder on any feature, as necessary, for example upon the input 320 and the output ports 340 of FIGS. 3 and 4 and 6A-6E. The method 700 may also include milling (or drilling) through substrate material (and/or conductive materials) (block 730) to form openings, such as voids or trenches (e.g., the trenches 616 of FIGS. 6A and 6A1). The method 700 includes printing (or depositing, e.g., via 3-D printing, additive manufacturing techniques) conductive material (such as the conductive fill 618 of FIGS. 6B and 6B1) into the voids/trenches (block 740), for example to form Faraday walls 510 of FIG. 5. Any of these steps may be done in different orders, repeated, or omitted (block 750) as necessary for a given circuit design. In some embodiments, such as that of FIGS. 6A-6E, multiple substrates may be involved in the manufacture of an electromagnetic circuit, and the method 700 includes bonding further substrates as necessary (block 760), for which various of the earlier described method blocks may be repeated (block 770) until complete. For example, in the embodiment of FIGS. 6A-6E, milling (block 730) and filling (block 740) trenches may be conducted after bonding the second substrate 610 (block 760).

Having described several aspects of at least one embodiment and a method for manufacturing and electromagnetic circuit, the above descriptions may be employed to produce various embodiments of a signal divider, such as those of FIGS. 3 and 4, as assembled into a structure 600c of FIGS. 6A-6E. In various embodiments, a signal divider in keeping with the aspects and embodiments of systems and methods herein may be manufactured with an overall thickness of 10 mils (0.010 inches, 254 microns) or less, and may include signal traces, such as the traces 322, 332, 342, as narrow as 4.4 mils (111.8 microns), 2.7 mils (68.6 microns), or even as narrow as 1.97 mills (50 microns), depending upon the tolerances and accuracy of various milling and additive manufacturing equipment used. Accordingly, electromagnetic circuits in accord with those described herein may be suitable for X-Band and higher frequencies, and in some cases up to 30 GHz or more.

Additionally, electromagnetic circuits in accord with those described herein may have a low enough profile (e.g., thickness of 10 mils or less), with accordant light weight, to be suitable for outer space applications, including folding structures to be deployed by unfolding when positioned in outer space.

Further, electromagnetic circuits manufactured in accord with methods described herein accommodate cheaper and faster prototyping, without the necessity for caustic chemicals, masking, etching, electroplating, etc. Simple substrates with pre-plated conductive material disposed on one or both surfaces (sides) may form the core starting material, and all elements of an electromagnetic circuit may be formed by milling (subtractive, drilling), filling (additive, printing of conductive and/or resistive inks), and bonding one or more substrates. Simple solder reflow operations and insertion of simple conductors (e.g., copper wire) are accommodated by methods and systems described herein.

Further, electromagnetic circuits manufactured in accord with methods described herein may accommodate deployment on, or designs calling for, non-planar surfaces. Thin, low-profile electromagnetic circuits, such as the signal dividers described herein and others, may be manufactured using mill, fill, and bond techniques as described herein to produce electromagnetic circuits having any desired contour, to adhere to a surface (such as a vehicle) or to support a complex array structure, for instance.

In various embodiments, a signal divider in keeping with the aspects and embodiments of systems and methods herein may be used as a signal divider or combiner to an array of radiative elements (e.g., antennas) and therefore may be utilized as a beamformer. Such a signal divider may also be coupled to phase adjusting circuitry (e.g., chips) to form more complex beam steering, null steering, and advanced array techniques.

An appendix that includes various additional details and aspects is filed concurrently herewith and is hereby incorporated in and part of this specification.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. A signal divider comprising:
   one or more substrates;
   a single input;
   a plurality of signal traces disposed on a surface of one of the one or more substrates, a first signal trace being connected to the single input by a first splitter, a second signal trace being connected to the first splitter and a second splitter, and a third signal trace being connected to the first splitter and a third splitter, a signal from the single input to the first signal trace being divided substantially equally by the first splitter, a signal from the second signal trace being divided substantially equally by the second splitter, and a signal from the third signal trace being divided substantially equally by the third splitter;
   four outlets, two outlets being connected to the second splitter by a fourth signal trace and a fifth signal trace and two outlets being connected to the third splitter by a sixth signal trace and a seventh signal trace;
   a resistive element formed of a resistive ink coupling the second and third of the three ports; and
   one or more Faraday walls positioned to isolate electromagnetic fields generated by the single input, the plurality of signal traces, the first, second and third splitters and the four outlets from one another,
   wherein the four outlets yield four substantially equal signals from the signal received at the single input.

2. The signal divider of claim 1, wherein the one or more substrates is two substrates and the plurality of signal traces is disposed between the two substrates.

3. The signal divider of claim 2, further comprising one or more milled trenches through the two substrates, the milled trenches being filled with a conductive ink to form substantially electrically continuous structures configured to shield electromagnetic energy.

4. The signal divider of claim 2, wherein the total thickness is 10 mils or less.

5. The signal divider of claim 1, further comprising four output ports fed by additional signal traces, the additional signal traces coupled to the second and third of the three ports, the additional signal traces configured to divide signals received from each of the second and third of the three ports to provide substantially equal divided signals to each of the four output ports.

6. The signal divider of claim 1, wherein the one or more substrates has a combined total thickness less than 13 mils.

7. A signal divider comprising:
two substrates bonded together and having a total thickness less than 13 mils;
a single input;
a plurality of signal traces disposed between the two substrates, a first signal trace being connected to the single input by a first splitter, a second signal trace being connected to the first splitter and a second splitter, and a third signal trace being connected to the first splitter and a third splitter, a signal from the single input to the first signal trace being divided substantially equally by the first splitter, a signal from the second signal trace being divided substantially equally by the second splitter, and a signal from the third signal trace being divided substantially equally by the third splitter;
four outlets, two outlets being connected to the second splitter by a fourth signal trace and a fifth signal trace and two outlets being connected to the third splitter by a sixth signal trace and a seventh signal trace; and
one or more milled trenches through the two substrates, the milled trenches being filled with a conductive ink to form substantially electrically continuous structures configured to shield electromagnetic energy and to isolate electromagnetic fields generated by the single input, the plurality of signal traces, the first, second and third splitters and the four outlets from one another.

8. The signal divider of claim 7, further comprising a resistive element formed of a resistive ink coupling the second and third of the three ports.

9. The signal divider of claim 7, wherein the two substrates have a total thickness less than 13 mils.

* * * * *